(12) United States Patent
Parshotam et al.

(10) Patent No.: US 7,091,730 B1
(45) Date of Patent: Aug. 15, 2006

(54) DUAL PROBE ASSEMBLY FOR A PRINTED CIRCUIT BOARD TEST APPARATUS

(75) Inventors: Mahesh P. Parshotam, Edmonds, WA (US); James M. Graverholt, Stanwood, WA (US); Alan D. Howard, Everett, WA (US)

(73) Assignee: Huntron, Inc., Mill Creek, WA (US)

( * ) Notice: Subject to any disclaimer, the term of this patent is extended or adjusted under 35 U.S.C. 154(b) by 0 days.

(21) Appl. No.: 11/182,697

(22) Filed: Jul. 15, 2005

(51) Int. Cl.
*G01R 31/02* (2006.01)

(52) U.S. Cl. ..................................... 324/754
(58) Field of Classification Search ................ None
See application file for complete search history.

(56) References Cited

U.S. PATENT DOCUMENTS

| | | | |
|---|---|---|---|
| 3,817,089 A * | 6/1974 | Eggleton et al. ............... 73/623 |
| 5,994,909 A * | 11/1999 | Lucas et al. ................ 324/754 |
| 6,271,673 B1 * | 8/2001 | Furuta et al. ................ 324/754 |
| 6,396,296 B1 * | 5/2002 | Tarter et al. ................ 324/765 |
| 6,828,768 B1 * | 12/2004 | McTigue ................... 324/72.5 |
| 2002/0011854 A1 * | 1/2002 | Kuji et al. .................. 324/754 |
| 2004/0257101 A1 * | 12/2004 | Miura et al. ................ 324/758 |
| 2005/0035776 A1 * | 2/2005 | Ueda .......................... 324/754 |

* cited by examiner

*Primary Examiner*—Vinh Nguyen
*Assistant Examiner*—Richard Isla-Rodas
(74) *Attorney, Agent, or Firm*—Jensen & Puntigam, P.S.

(57) ABSTRACT

The dual probe assembly is used with a printed circuit board test apparatus. It includes a first, satellite test probe holder for a first, satellite test probe and a motor for rotating the first test probe holder. It further includes a second, main test probe holder for a second, main test probe and a motor for moving the second test probe holder. The first test probe holder can move without affecting the position of the second test probe, while the second test probe holder is connected to the first test probe holder in such a manner that movement of the second test probe holder moves the first test probe holder, wherein both a selected distance between the two test probes and a selected angular orientation therebetween can be achieved.

6 Claims, 4 Drawing Sheets

DUAL PROBE ASSEMBLY FOR A PRINTED CIRCUIT BOARD TEST APPARATUS

TECHNICAL FIELD

This invention relates generally to prober assemblies for use with automatic circuit board test apparatus, and more particularly concerns such an apparatus which includes dual probes.

BACKGROUND OF THE INVENTION

A typical "flying probe" test apparatus operates electromechanically, under software control, to test a plurality of predetermined points on a printed circuit board. The printed circuit board to be tested is mounted in the test apparatus in a fixed position, and the probe is then moved automatically to test user-selected points on the board. The flying probe assembly, typically with a single probe, is used to test the electrical characteristics of a particular circuit portion on the board by supplying a test signal to the selected points and then receiving the return signal from the circuit. Typically, a single pin probe will require an electrical signal reference or return path connection, which could be a ground wire externally connected to the circuit. However, the ground return path could also adversely affect the test measurement and produce inaccurate results.

In RF (radio frequency) measurements, the ground return path is important to the test. Calibration procedures are required to take into account the spacing and the particular dielectric material between the transmission line and the ground line return path. The spacing between the transmission line and the ground line could vary in length and orientation and produce differences in test results.

Most prior art probe assemblies have a fixed physical spacing between the test pin and the ground pin, although some are mechanically adjustable so that the same probe can be used for different pin-to-ground spacings and orientations. Generally, the use of specific materials and short ground wires are important to minimize the losses and the degeneration of the test signal.

In addition, some prior art probe assemblies include two probes, so that the same probe assembly can be used for different pin-to-ground spacings and orientations, as well as different pin-to-pin connections and tests. The two probes can be separately adjustable, typically mechanically, to allow for different spacings and orientations of the two probes. However, such dual probe arrangements are typically quite complex, expensive and difficult to implement.

Hence, there is a specific need for a low-cost flying probe assembly in which two probes can be moved in such a manner to produce variable spacings and orientations, for cost-effective access to a plurality of test points on an electronic circuit.

SUMMARY OF THE INVENTION

Accordingly, the present invention is a dual probe fixture for a printed circuit board test apparatus, comprising: a first, satellite test probe holder with a first, satellite test probe therein; a motor for moving the first test probe holder; a second, main test probe holder with a second, main test probe therein; and a motor for rotating the second test probe holder, wherein the first test probe holder and first test probe can be moved without affecting the position of the second test probe holder and second test probe, and wherein the second test probe holder is connected to the first test probe holder such that rotation of the second test probe holder results in a related movement of the first test probe holder and the first test probe therein, wherein movement of the first test probe holder determines a distance between the first test probe and the second test probe and rotation of the second test probe holder determines the angular orientation between the first test probe and the second test probe.

BEST MODE FOR CARRYING OUT THE INVENTION

Figure 1:
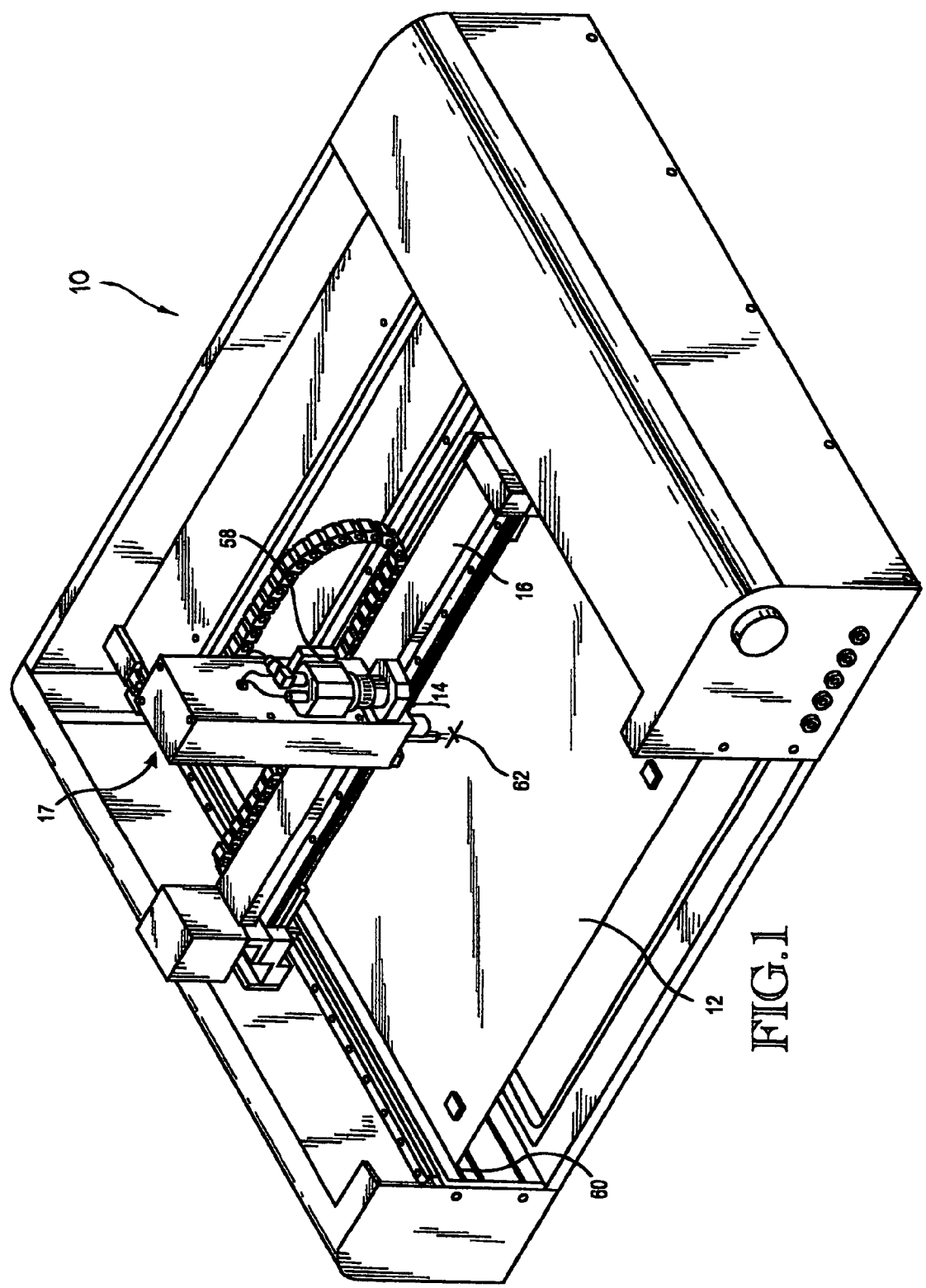
FIG. 1 is a perspective view of a circuit board tester with the system shown and described herein.

FIG. 1 is a perspective view of an X-Y-Z automatic test apparatus 10 which is used to test printed circuit cards/boards and particularly selected points on a printed circuit card 12 which is mounted in the test apparatus 10. A test probe assembly 14 is part of a prober apparatus 17 which is mounted on a carriage 16 and is capable of moving on the carriage 16 in the "X" direction, while the carriage 16 is movably mounted on the test apparatus 10 so as to move the prober apparatus 17 in the "Y" direction. The prober apparatus 17 also includes a mechanism (not shown) for moving the probe assembly 14 in the "Z" direction (toward and away from the printed circuit card).

In operation, the test probe assembly 14 is moved automatically via software control to a selected point on the card/board to be tested. A test signal is then applied to the selected point through the probe assembly 14. The results from application of the test signal are then analyzed by the test apparatus 10 to determine whether or not the particular circuit portion being tested is within its pre-established operating range.

Figure 2:
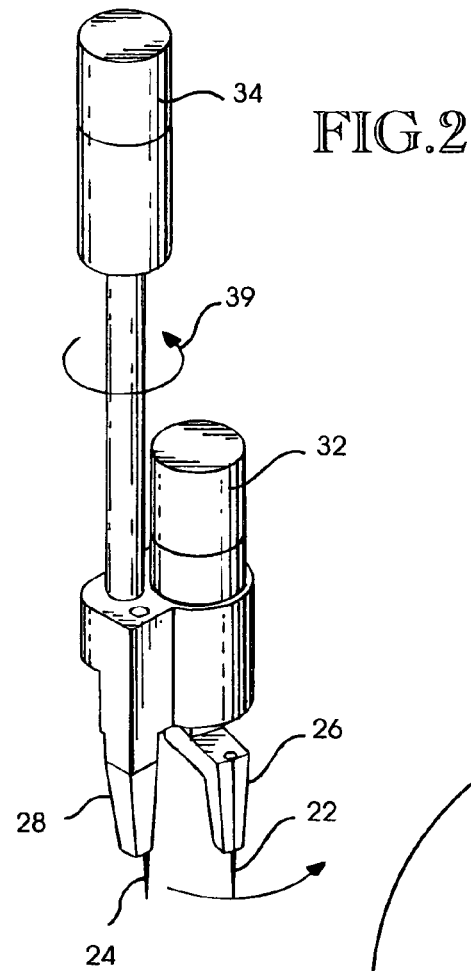
FIG. 2 is an elevational view showing the dual probe mechanism which is described herein.

Probe assembly 14, which is shown in FIG. 2, has a structure which permits any two points on the board to be accessed conveniently. Probe assembly 14 includes two probe members 22 and 24. Each probe member is conventional and is mounted in its own probe holder 26 and 28, respectively. Probe holder 28 is the main probe holder in which probe element 24, also referred to as a principal probe, is mounted; movement of probe holder 28 produces a movement of both probes, as will be described in more detail below. Probe holder 28 in the embodiment shown is machined from a resin, which has the advantages of good electrical insulation, as well as being readily machineable. Various materials can be used, however, for both probe holders 26 and 28. Probe holder 26 is the secondary probe holder, in which probe element 22, also referred to as a satellite probe, is mounted.

A stepper motor 32 is connected to the probe holder 26, and in operation rotates probe holder 26, which in turn results in a rotation of satellite (secondary) probe 22. Stepper motor 32 includes an integrated gear head and shaft encoder arrangement, which are generally known in the art but not specifically shown, for accurately tracing the angular movement of probe element 22 produced by the action of the stepper motor 32. The rotational movement of satellite probe 22 changes the distance between satellite probe 22 and the principal (main) probe 24. Hence, in the embodiment shown, the distance between the two probes 22 and 24 is determined by the rotation of satellite probe 22.

Controlling the movement of probe holder 28 is a stepper motor 34. Stepper motor 34 drives an elongated stepper motor shaft 39, which in turn is connected to probe holder 28. Probe holder 28 is mounted to probe holder 26 so that as probe holder 28 is rotated by stepper motor 34, probe holder 26 and probe 22 also rotate. The rotational action of probe 24 changes the orientation of probes 22 and 24 in the X-Y plane. Hence, rotation of probe holder 26 by stepper motor 32 changes the distance between the two probes, while rotation of probe holder 28 by stepper motor 34 changes the orientation of the two probes. This allows the two probes to contact any two points on the board under test within the physical limits of the probe movements.

In operation, if the two probe elements 22 and 24 are to be positioned on two specific points on the printed circuit board being tested, it is first necessary to mathematically calculate the distance between the two points and the angle of the line joining the two points (orientation). After these calculations are made, stepper motor 32 rotates to produce the desired distance between the two probes. Stepper motor 34 then rotates to produce the desired angle (orientation) between the two probes. With the arrangement shown above, any two points on the board can be accessed automatically, as long as the separation of the two points on the board does not exceed the physical separation capability of the two probes.

Figure 3:
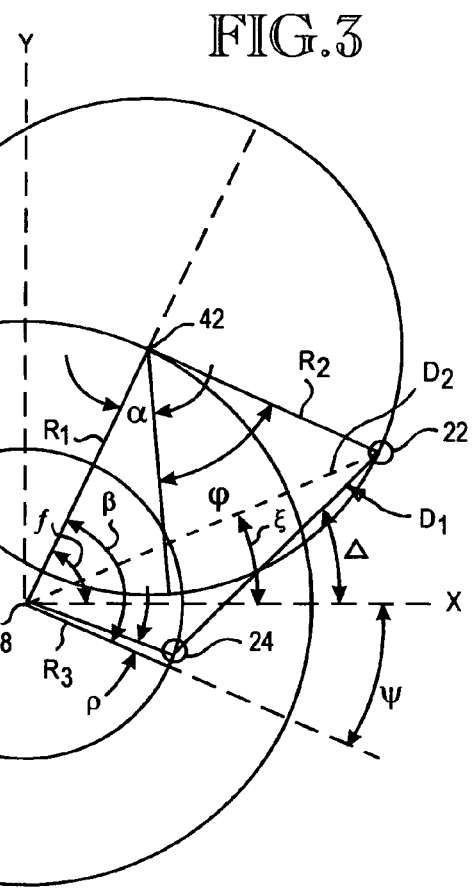
FIG. 3 is a diagram showing the respective movements of the two probes in the probe assembly of FIG. 2.

FIG. 3 shows the geometric, angular relationship between the movements of the two probes. Probe member 24 is the main probe and rotates with a radius $R_3$ around a main center point 38. The radius of rotation of probe 24 can be varied, depending on the configuration of probe holder 28. Satellite probe member 22 rotates around a satellite center point 42, with a radius $R_2$. Satellite center point 42 is related to main center point 38 through probe holder 28 being connected to probe holder 26 such that as probe holder 28 rotates about main center point 38, satellite center point 42 also rotates about main center point 38, moving with it satellite probe 22.

Figure 4:
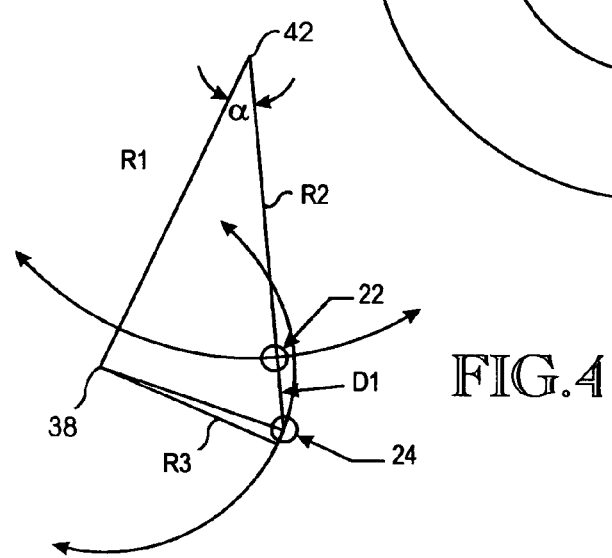
FIG. 4 is a diagram showing the "home" position of the two probes in the probe assembly of FIG. 2.

In the home position of the probe assembly, satellite center point 42 and probe members 22 and 24 are located in a straight line (FIG. 4). Radius line $R_1$ connects the main and satellite center points 38 and 42, while radius line $R_3$ connects center point 38 and probe 24, as shown in FIG. 4. FIG. 3 shows an angle of rotation $\rho$ as probe member 24 moves away from its home position and an angle of rotation $\phi$ as probe member 22 moves away from its home position. FIG. 3 shows both probes 22 and 24 moved away from their home position. Angle $\psi$ is shown as the angle between the X axis in FIG. 3 and the radius line $R_3$ (with probe 24 in its home position). The home position is established by a switch on the apparatus.

Probe member 22 can be moved away from its home position either by action of stepper motor 32 or stepper motor 34, while stepper motor 34 alone controls the movement of probe member 26. The two angles $\rho$ and $\phi$ define the orientation of two selected points in the X-Y plane of the test apparatus. Once the angles are calculated, the two stepper motors can be controlled (the number of steps determined) accordingly.

From FIG. 3, angle $\alpha$ can be calculated as follows:

$$\frac{R_3}{\sin\alpha} = \frac{R_2 + D_1}{\sin\beta},$$

so that $$\alpha = \arcsin\left(\frac{R_3 * \sin\beta}{R_2 + D_1}\right)$$

where $D_1$ is the distance between probe members 22 and 24 in the home position (FIG. 4). The distance between center point 38 and probe 22 is shown as $D_2$, which can be calculated from the X and Y coordinates of probe element 24. The angle $\phi$ can be calculated as follows:

$$\varphi = \arccos\left[\frac{(D_2^2 - R_1^2 - R_2^2)}{-2 * R_1 * R_2}\right] - \alpha$$

For angle $\rho$, where $\beta$ is within the region between radius line $R_3$ and the X axis $$\rho = \psi - \arccos(X/R_3)$$

where X is the X coordinate value of probe 24.

The above formula for angles $\psi$ and $\beta$ must be adjusted for each quadrant in the XY coordinate system. Any two points in the XY coordinate system can thus be located by the angles of rotation $\phi$ and $\rho$. The values of $\phi$ and $\rho$ can then be translated to the number of steps that each stepper motor must move in order for the probes to contact the selected test points.

Referring to FIG. 1 again relative to calibration of the position of probe assembly 14 relative to the circuit board 12 mounted in the test assembly, a high resolution camera 58 is mounted to prober apparatus 17. The board under test is clamped into holders 60 in the test apparatus 10. Camera 58 displays images of the board. By entering the location on the board of a particular target 62, the carriage 16 and the prober apparatus 14 can be moved such that the camera is positioned over the target test point. That position of the camera is then recorded in software. The main probe 24 is then positioned over the target. The X-Y position of the main probe is then recorded. The satellite probe is then positioned over the test point, with the position being recorded. The main probe is then rotated 180° and positioned over the test point again. This position is also recorded. The same is done for the satellite probe. The distances $R_1$, $R_2$, $R_3$, angle $\psi$, angle $\rho$ and distance $D_1$ are then calculated and stored for reference.

Figure 5:
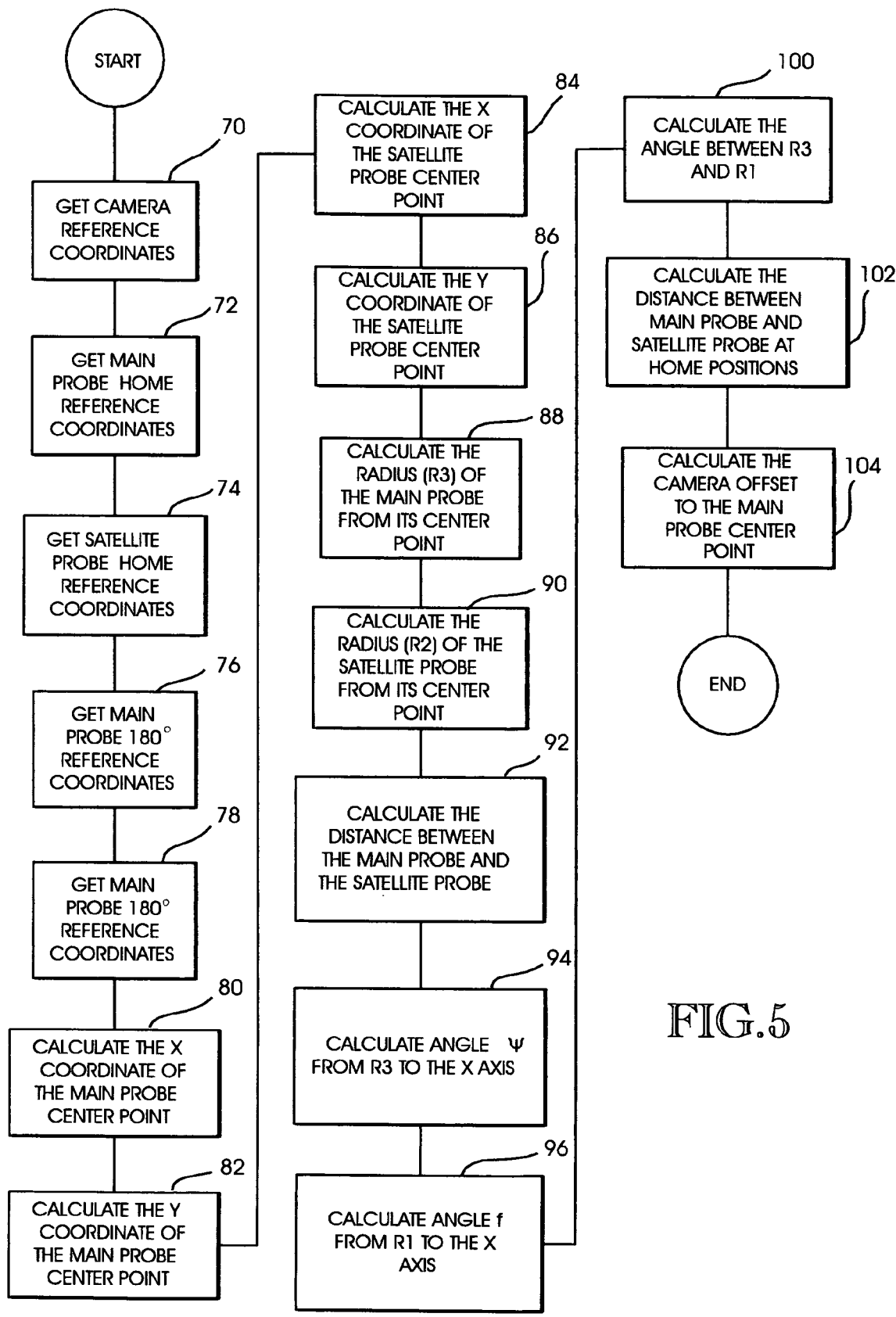
FIGS. 5 and 6 are software flowcharts for operation and control of the system shown and described herein.
Figure 6:
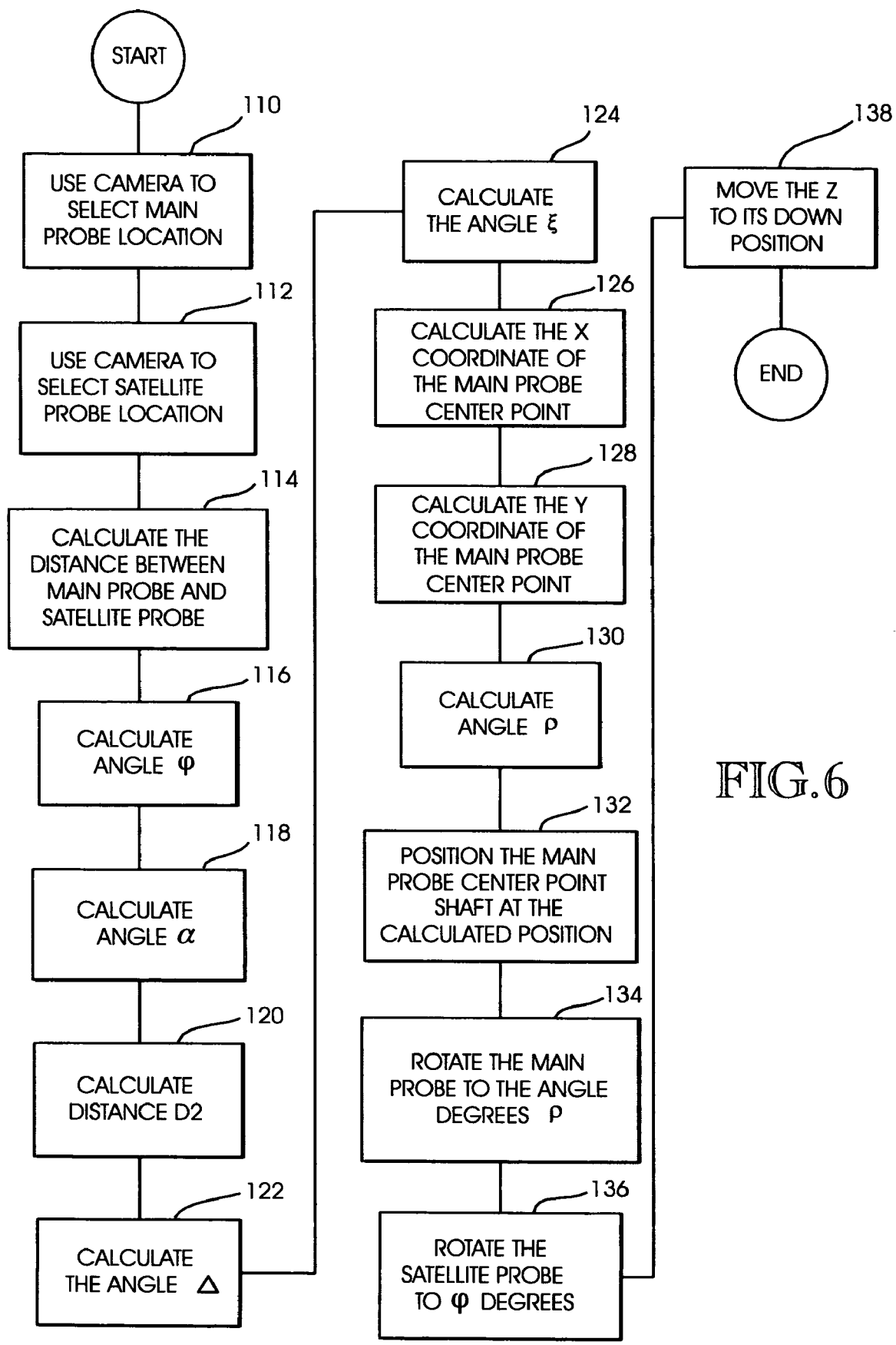

FIGS. 5 and 6 show flowcharts for the software which controls the position of the camera and the probe assembly during calibration and test operations. Relative to the camera calculations (FIG. 5), the camera reference coordinates are first determined at 70. The main probe home reference coordinates are obtained at 72 and the satellite probe home reference coordinates at 74. The 180° reference coordinates for the main probe and the satellite probe are then obtained, at 76 and 78. The X and Y coordinates for the main center point 38 are then calculated at 80 and 82, while the X and Y coordinates of the satellite center point 42 are calculated at 84 and 86.

The radius distance of main probe 24 from center point 38 and the radius distance of satellite probe 22 from center point 42 are then calculated, at 88 and 90. The distance between the two probes is then calculated, at 92. The angle ψ between line $R_3$ and the X axis is then calculated, at 94. Further, the angle f between the line $R_1$ and the X axis is calculated, at 96. The angle β between lines $R_1$ and $R_3$ is calculated, at 100. Next, the distance between the two probes is determined when they are in their home positions, at 102. Finally, at 104, the camera offset from the main center point 38 is determined.

The probe position calculations in software are set forth in FIG. 6. The camera is used to obtain the desired location of main probe 24, at 110. The camera is then used to obtain the desired location of the satellite probe 22, as shown at 112. Referring to FIG. 3 as well as FIG. 6, the distance between the probe elements 24 and 22 is then calculated, at 114. Angles φ and α are then calculated, at 116 and 118. The distance $D_2$ between the main center point 38 and the location of probe element 22 is then calculated, at 120. The angle A between line $D_1$ and the X axis is then calculated, at 122. The angle ξ between line $D_2$ and the X axis is then calculated, at 124. The X and Y coordinates of the main center point 38 are then calculated, at 126 and 128. Angle ρ is then calculated, at 130.

The main center point 38 is then positioned at the calculated position, as shown at 132. The main probe 24 is then rotated to the ρ calculated angle, while the satellite probe 22 is rotated to the φ angle, as shown at 134, 136. At this point, the two probes are over the two desired pin locations. The probe assembly is then moved down in the Z direction at 138 in order to accomplish the test. The test signal is applied and the results recorded.

A similar process is carried out for other desired test locations on the board.

As discussed above, movement of the satellite probe will provide the correct distance, i.e. spacing, between the two probes. While in the embodiment shown and described the main probe is rotated (with the satellite probe moving therewith) to accomplish the desired angular orientation between the two probes, it should be understood that other movements of the probes, including linear movements, can be implemented to accomplish the desired orientation.

Although a preferred embodiment of the invention has been disclosed for purposes of illustration, it should be understood that various changes, modifications and substitutions may be incorporated in the embodiment without departing from the spirit of the invention which is defined by the claims which follow.

What is claimed is:

1. A dual probe fixture for a printed circuit board test apparatus, comprising:
    a first, satellite test probe holder with a first, satellite test probe therein;
    a motor for moving the first test probe holder;
    a second, main test probe holder with a second, main test probe therein;
    a motor for rotating the second test probe holder about an axis, wherein the second probe is mounted on the second probe holder at a distance away from said axis; and
    wherein the first test probe holder and first test probe can be moved without affecting the position of the second test probe holder and second test probe, and wherein the second test probe holder is connected to the first test probe holder such that rotation of the second test probe holder results in a related movement of the first test probe holder and the first test probe therein, wherein movement of the first test probe holder determines a distance between the first test probe and the second test probe and rotation of the second test probe holder determines the angular orientation between the first test probe and the second test probe.

2. The probe fixture of claim 1, wherein the second test probe holder and the second test probe rotate about a first position in the X-Y plane of the circuit board and wherein the first probe holder and the first test probe rotate about a second position in the X-Y plane of the circuit board, a selected distance from said first X-Y position.

3. The probe fixture of claim 1, wherein the first test probe holder moves linearly to produce the desired distance between the first and second test probes.

4. The probe fixture of claim 1, wherein the first test probe holder is moved first to obtain a desired distance between the two test probes, and then the second test probe holder is rotated to obtain the desired angular orientation between the two test probes.

5. The probe fixture of claim 1, including means for positioning the first and second test probes, respectively, at home positions prior to moving them to achieve a desired pre-selected separation distance and orientation for contacting two selected points on a circuit board for testing.

6. The probe fixture of claim 5, including means for obtaining the home position reference coordinates of the first and second test probes for a selected printed circuit board being tested.

* * * * *